United States Patent [19]

Mycynek et al.

[11] Patent Number: 5,781,065
[45] Date of Patent: Jul. 14, 1998

[54] CIRCUIT FOR CAUSING FPLL TO LOCK IN DESIRED PHASE

[75] Inventors: Victor G. Mycynek; Leif W. Otto, both of Des Plaines, Ill.

[73] Assignee: Zenith Electronics Corporation, Glenview, Ill.

[21] Appl. No.: 696,427

[22] Filed: Aug. 13, 1996

[51] Int. Cl.$^6$ .......................... H03D 3/00; H03L 7/087; H03L 7/095
[52] U.S. Cl. .......................... 329/325; 331/11; 331/14; 331/23; 331/DIG. 2; 455/208; 455/260
[58] Field of Search .......................... 329/308, 325, 329/360; 327/156–159; 331/11, 14, 20, 23, DIG. 2; 375/376; 455/208, 214, 260, 337

[56] References Cited

U.S. PATENT DOCUMENTS 5,260,671  11/1993  Iso et al. .......................... 329/302
5,359,661  10/1994  Manloue et al. .......................... 331/DIG. 2 X
5,436,598  7/1995  Harris .......................... 331/11
5,539,357  7/1996  Rumreich .......................... 331/15 X

*Primary Examiner*—David Mis

[57] ABSTRACT

A biphase stable FPLL includes a lock switch, operated in response to a frequency lock condition, that forces a predetermined voltage on the input of the third multiplier to guarantee that the loop locks up in a phase that produces a desired polarity of demodulated signal. A frequency lock indicator operates the lock switch to force the predetermined voltage on the third multiplier irrespective of the actual lock up phase of the loop. If the lock up phase is wrong, the voltage reversal causes the VCO to slip 180° in phase and the loop locks up in its other bistable state.

10 Claims, 3 Drawing Sheets

CIRCUIT FOR CAUSING FPLL TO LOCK IN DESIRED PHASE

CROSS REFERENCE TO RELATED APPLICATIONS

This application is related to applications Ser. No. 645,175, filed May 13, 1996, entitled CONTROLLING FPLL POLARITY USING PILOT SIGNAL AND POLARITY INVERTER, Ser. No. 500,272 entitled POLARITY SELECTION CIRCUIT FOR BI-PHASE STABLE FPLL and Ser. No. 678,902 entitled FPLL WITH THIRD MULTIPLIER AS PRESCALER, all of which are assigned to Zenith Electronics Corporation.

BACKGROUND OF THE INVENTION AND PRIOR ART

This invention relates generally to frequency and phase locked loops, hereinafter referred to as FPLLs, and specifically to a method and apparatus for controlling the locking phase of an FPLL.

The FPLL differs from conventional phase locked loops in that it has both a frequency locking and a phase locking operation, which gives it the advantage of relatively wide pull in range and good narrow band phase locking without sacrifice of speed. An example of an FPLL is disclosed in U.S. Pat. No. 4,072,909. An example of the use of an FPLL for video detection in a television receiver is disclosed in U.S. Pat. No. 4,091,410. Both of the above patents are owned by the assignee of the present application and both are incorporated by reference herein.

As is discussed in the above patents, the FPLL is biphase stable. Thus the loop will lock up in either of two stable states that are displaced by 180°. The prior art, as exemplified by U.S. Pat. No. 4,091,410 above, derives an information signal from the output of the limiter in the FPLL to indicate the particular lock up phase of the FPLL. The information signal is used to change the phase of the demodulated video signal, as required.

In above-mentioned copending application Ser. No. 645,175, the pilot signal is processed to derive the information signal which indicates the lock up phase of the FPLL. If the information signal indicates that the lock up phase is inverted, i.e. that the I channel data signal has a polarity that is opposite to the desired polarity, the IF signal supplied to the I and Q multipliers is inverted. This results in near instantaneous inversion of the I channel data signal (as well as the Q channel output signal). The lock up phase of the FPLL is not affected because the loop filter cannot respond quickly enough to the simultaneous polarity changes in the I and Q signals and therefore the polarity of the error signal applied to the loop filter remains the same.

In above-mentioned copending application Ser. No. 500,272 successive data segment sync signals are used to determine the lock up polarity of the FPLL and for developing a polarity signal. The polarity signal inverts the digitized I channel data signal, if it has the wrong polarity, as determined by the polarity signal, and is fed back to the input of the FPLL limiter to stabilize the polarity of the third multiplier. Here again, the lock up phase of the FPLL is not changed.

The present invention is directed to a method and apparatus for forcing and stabilizing the lock up phase of an FPLL in response to a lock indicator signal.

OBJECTS OF THE INVENTION

A principal object of the invention is to provide a novel method and apparatus for assuring a preselected lock up polarity of a biphase stable FPLL.

Another object of the invention is to provide an improved method of operating a biphase stable FPLL.

A further object of the invention is to provide an improved biphase stable FPLL.

BRIEF DESCRIPTION OF THE DRAWING

These and other objects and advantages of the invention will be apparent upon reading the following description in conjunction with the drawings, in which.

DESCRIPTION OF THE PREFERRED EMBODIMENT

Figure 1:
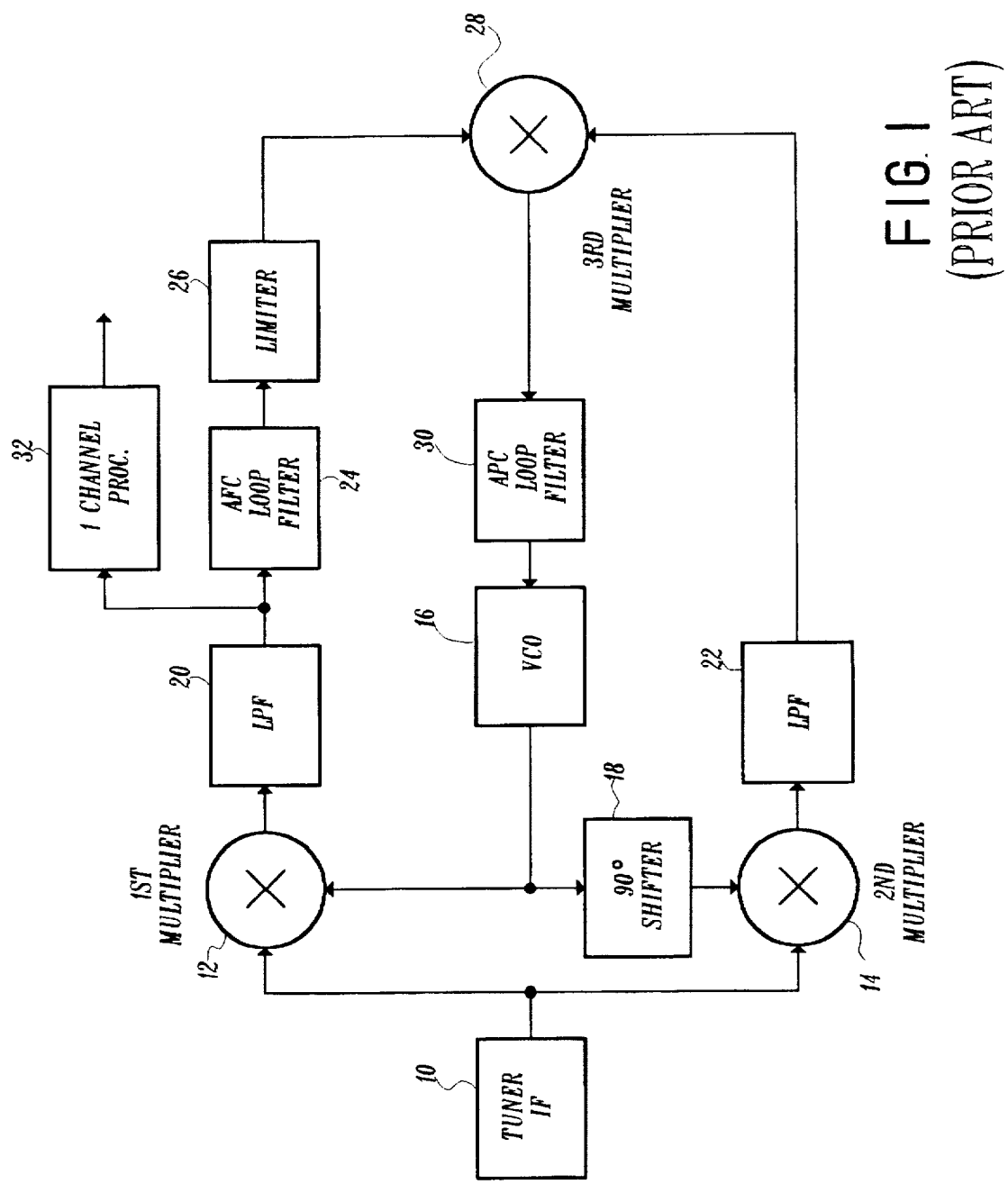
FIG. 1 is a simplified diagram of a prior art FPLL circuit.

Referring to the prior art FPLL of FIG. 1, a tuner/IF source 10 supplies a modulated input signal to an input of a first (I channel) multiplier 12 and to an input of a second (Q channel) multiplier 14. A voltage controlled oscillator (VCO) 16 supplies a demodulating signal to the other input of multiplier 12 and to a 90° phase shifter circuit 18 that supplies a 90° phase displaced signal to the other input of second multiplier 14. The output of first multiplier 12 is coupled to a low pass filter (LPF) 20. The output of LPF 20 supplies an automatic frequency control (AFC) low pass filter circuit 24, that in turn supplies a limiter 26. Limiter 26 supplies its output to the input of a third multiplier 28. The other input of third multiplier 28 is supplied from an LPF 22 that is supplied with the output of second multiplier 14. The output of third multiplier 28 is coupled to an automatic phase control (APC) loop filter 30 that develops the control signal for VCO 16. The I channel output of LPF 20 also supplies an I channel data processor 32.

The above-described circuit, in a television environment, comprises a conventional FPLL arrangement that receives a modulated video signal input and delivers a demodulated video signal output. It will be appreciated by those skilled in the art that the modulated signal need not be limited to a video or television signal, but may be any information signal. The FPLL circuit functions as described in the above-mentioned patents.

Figure 2:
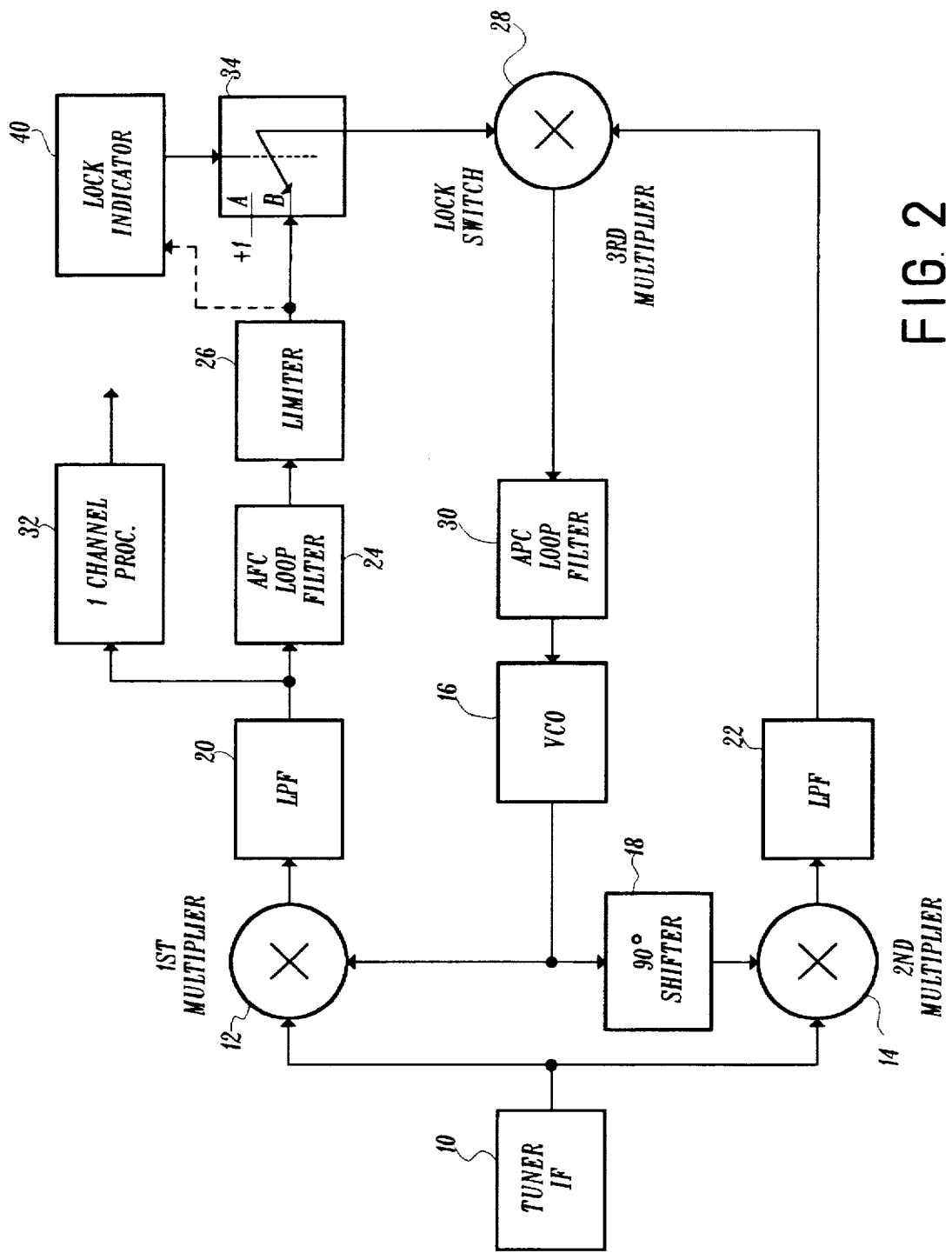
FIG. 2 is a simplified diagram of an FPLL constructed in accordance with the invention.

The inventive arrangement is shown in FIG. 2, which is identical to the FPLL of FIG. 1 except for the addition of a lock indicator 40 and a lock switch arrangement 34. It will be appreciated that the lock switch arrangement 34 is shown as a simple mechanical device for simplicity, the actual implementation thereof being electronic. The lock indicator 40 may take any of the prior art forms such as the information signal in the above-mentioned patents. Also, the lock indicator 40 may be coupled to the output of limiter 26 as indicated by the dotted line connection, since the limiter output signal is indicative of the lock up phase of the FPLL. In this connection, for more efficient operation, the lock indicator 40 may be coupled to the output of LPF 20 through a separate circuit arrangement (not shown) that comprises another LPF and another limiter. The advantage is that the separate circuit arrangement may be specifically tailored to the characteristics of the signal to be demodulated, e.g. to the pilot. In any case, the lock switch 34 is operable in response to the lock indicator 40 for coupling a signal at its A input to the third multiplier 28 when a frequency lock (or very near frequency lock) condition has been attained by the frequency lock portion of the FPLL. The A input of lock switch 34 is connected to a fixed potential of +1 which, it will be appreciated, corresponds to the polarity of signal necessary to achieve the desired lock up phase for the FPLL to develop the wanted I channel signal polarity.

In standard FPLL operation, the third multiplier 28 changes the polarity of the error signal in the PLL portion (VCO 16, phase shifter 18, second multiplier 14, LPF 22, third multiplier 28 and APC loop filter 30) of the FPLL. When its input from the limiter 26, via terminal B of lock switch 34, is negative, third multiplier 28 inverts the error signal used to phase lock the VCO. When this input is positive, no inversion takes place. It is the polarity or phase of the error signal that determines which of the two stable states the biphase stable FPLL will lock to. When lock or near lock has been achieved, there is no longer a need for the frequency lock portion of the FPLL since the IF signal carrier is within the bandwidth of the PLL portion of the FPLL. At this time the limiter is supplying a signal to the third multiplier having a decided DC voltage (with minimal contributions from the AFC filtered data signal). Essentially the FPLL is operating as a single PLL at this time.

In the FPLL of the invention, during this locked or nearly locked condition, the lock switch 34 is operated to change its input from the limiter output voltage at terminal B to the fixed voltage at terminal A. This forces the now-operating PLL to a predetermined lock up phase condition. If the predetermined lock up phase condition is the same as the present locked condition of the FPLL, the loop remains locked. If the predetermined lock up phase condition differs from the present locked condition of the FPLL, the loop will slip one half cycle and relock in the desired phase. Should the loop be at a near lock condition, it will proceed to lock up in the predetermined phase condition upon movement of the lock switch 34 to the fixed DC voltage at terminal A. It should be noted that when lock switch 34 is in its A terminal position, any disturbances from the AFC filtered and limited data signal are blocked from entry into the PLL portion of the circuit and the FPLL operation is stabilized.

In operation, when the FPLL is locked up, the pilot in the received signal develops a +1 or −1 output from limiter 26. The lock up phase of the FPLL is determined by the polarity of the output from limiter 26 which has been assumed to be +1 for the desired polarity of I channel data to be obtained. Prior to lock, the output of limiter 26 supplies a beat note-related square wave to third multiplier 28 via lock switch 34. If the dotted line connection is used, the signal supplied to frequency lock indicator 40 is also a square wave. Frequency lock indicator 40 does not respond to the square wave and therefore does not operate lock switch 34, thus permitting normal frequency locking to occur via limiter 26. When frequency lock occurs, the output of limiter 26 becomes either a +1 or a −1 and, in either event, frequency lock indicator 40 detects this condition and operates lock switch 34 to connect a fixed +1 voltage to the input of third multiplier 28, thus forcing the FPLL to phase lock in the predetermined phase to produce the desired I channel signal polarity. If the output of limiter 26 was +1 at frequency lock, no change in signal polarity occurs due to the operation of lock switch 34 and the loop remains locked in the desired phase. If the output of limiter 26 was −1, however, the operation of lock switch 34 impresses a +1 on third multiplier 28, causing the VCO 16 to "slip cycle" and change its phase by 180°. The loop immediately stabilizes in the other of its bistable states (which is the desired lock up phase). Should frequency lock be broken for any reason, frequency lock indicator 40 releases switch 34 and the frequency acquisition processes is restarted.

Figure 3:
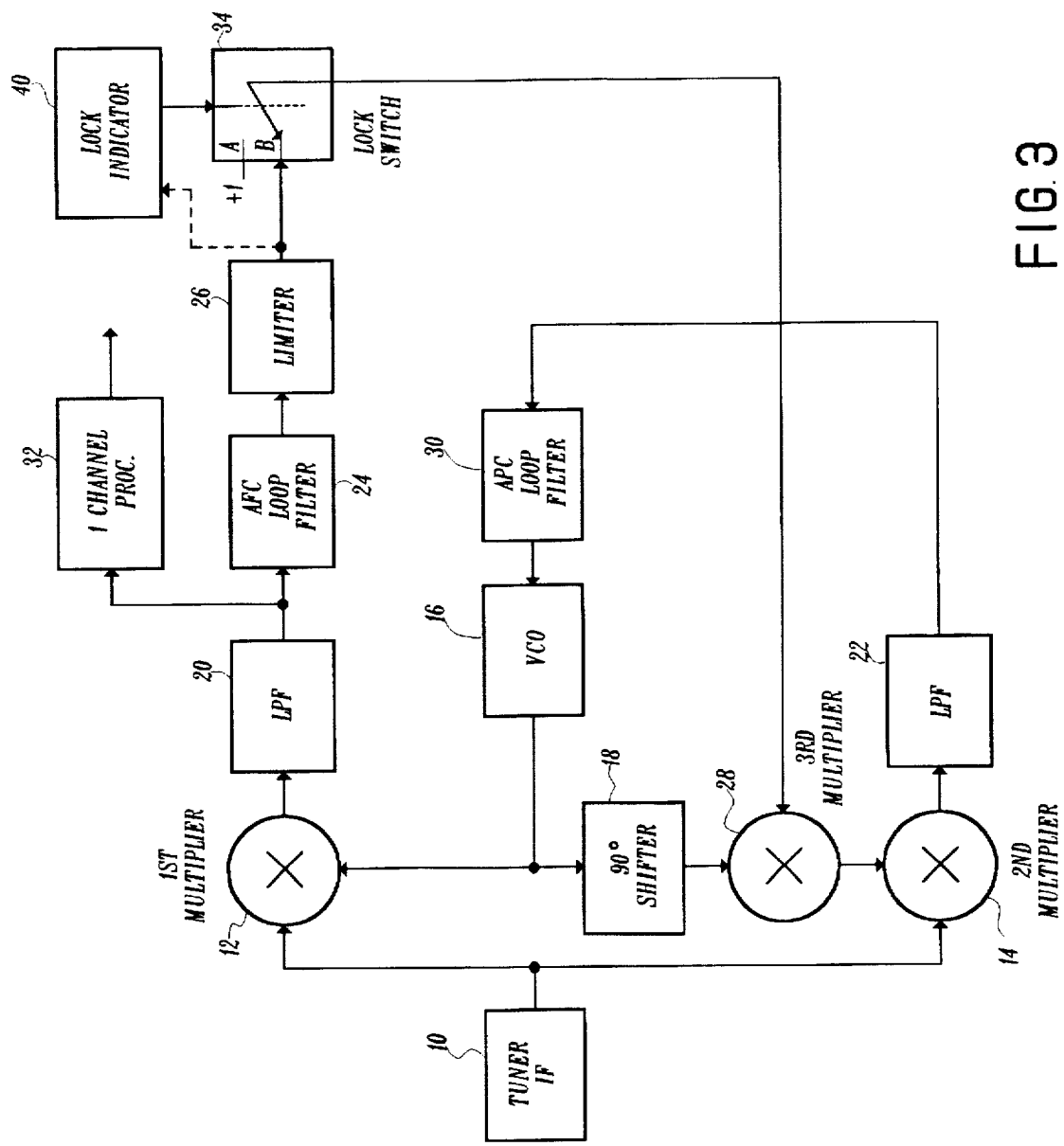
FIG. 3 is a modification of the FPLL of FIG. 2.

The FIG. 3 implementation incorporates the invention in above-mentioned copending application Ser. No. D6944. In this arrangement, the third multiplier 28 is relocated from a path, where DC offsets and non linearities can negatively impact performance, to an AC path. The third multiplier 28 is inserted between phase shifter 18 and second multiplier 14 and the output of LPF 22 is coupled to the APC loop filter 30. The circuit has been shown to perform identically to the circuit of FIG. 2.

What has been described is a novel bistable FPLL arrangement that will always lock up in the phase that assures a preselected output signal polarity. It is recognized that numerous changes in the described embodiment of the invention will occur to those skilled in the art without departing from its true spirit and scope. The invention is to be limited only as defined in the claims.

What is claimed is:

1. In a biphase stable FPLL of the type including means for demodulating an input signal with a pair of ninety degrees phase displaced oscillatory signals, an AFC low pass filter and a limiter, and means for supplying an output signal having either of two polarities, the improvement comprising:

automatic phase locking means for forcing the FPLL to lock up such that said output signal has a selected one of said two polarities.

2. The FPLL of claim 1, wherein said automatic phase locking means comprises:

means for developing a lock indicator signal that indicates frequency locking of said FPLL; and means for using said lock signal to force said FPLL to locking in a phase to produce said selected one of said two polarities of output signal.

3. The FPLL of claim 2, wherein said automatic phase locking means further comprises:

switch means;

a reference potential; and means for operating said switch means to apply said reference potential to said FPLL responsive to said lock indicator signal.

4. The FPLL of claim 3, wherein said FPLL further includes third multiplier means and wherein said automatic phase locking means is coupled between the output of said FPLL and the input of said third multiplier means.

5. A method of operating a biphase stable FPLL comprising:

deriving a lock indicator signal that indicates frequency locking of the FPLL; and using the lock indicator signal to assure that the FPLL locks up in a predetermined phase.

6. The method of claim 5, further comprising:

controlling the input to the third multiplier in the FPLL to determine the phase locking condition.

7. The method of claim 6, further comprising:

supplying a reference potential to the third multiplier responsive to the lock indicator signal.

8. A biphase stable FPLL comprising:

means for deriving a lock indicator signal from said FPLL that indicates frequency locking of said FPLL; and means for forcing a predetermined phase locking condition of said FPLL in response to said lock indicator signal.

9. The FPLL of claim 8, further including:

third multiplier means, and wherein said forcing means comprises;

switch means;

means for controlling said switch means with said lock indicator signal; and means for supplying the input of said third multiplier means from said switch means.

10. The FPLL of claim 9, wherein said forcing means further comprises:

a reference potential; and said switch means switching said reference potential to said input of said third multiplier means responsive to said lock indicator signal.

* * * * *